United States Patent
Liou et al.

(10) Patent No.: US 10,153,353 B1
(45) Date of Patent: Dec. 11, 2018

(54) SEMICONDUCTOR STRUCTURE

(71) Applicant: UNITED MICROELECTRONICS CORP., Hsin-Chu (TW)

(72) Inventors: En-Chiuan Liou, Tainan (TW); Yu-Cheng Tung, Kaohsiung (TW); Rung-Yuan Lee, New Taipei (TW); Chih-Wei Yang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/613,278

(22) Filed: Jun. 5, 2017

(51) Int. Cl.
| | |
|---|---|
| *H01L 29/49* | (2006.01) |
| *H01L 29/423* | (2006.01) |
| *H01L 29/40* | (2006.01) |
| *H01L 29/66* | (2006.01) |
| *H01L 29/10* | (2006.01) |

(52) U.S. Cl.
CPC .......... *H01L 29/49* (2013.01); *H01L 29/1037* (2013.01); *H01L 29/408* (2013.01); *H01L 29/42312* (2013.01); *H01L 29/66545* (2013.01); *H01L 29/66553* (2013.01); *H01L 29/66606* (2013.01)

(58) Field of Classification Search
None
See application file for complete search history.

(56) References Cited

U.S. PATENT DOCUMENTS

| | | | |
|---|---|---|---|
| 9,153,668 B2 | 10/2015 | Ching | |
| 2007/0246783 A1* | 10/2007 | Moon | H01L 27/10876 257/384 |
| 2012/0286360 A1* | 11/2012 | Guo | H01L 29/66545 257/335 |
| 2013/0017680 A1* | 1/2013 | Haran | H01L 29/66545 438/595 |
| 2013/0082311 A1* | 4/2013 | Cheng | H01L 29/7834 257/288 |
| 2016/0056157 A1* | 2/2016 | Ching | H01L 29/66795 257/369 |
| 2016/0056271 A1 | 2/2016 | Liaw | |
| 2016/0343825 A1* | 11/2016 | Bae | H01L 29/665 |
| 2017/0098711 A1 | 4/2017 | Hsiao | |
| 2017/0117192 A1 | 4/2017 | Min | |
| 2017/0317185 A1* | 11/2017 | Cheng | H01L 29/66545 |

* cited by examiner

Primary Examiner — Asok K Sarkar
(74) Attorney, Agent, or Firm — Winston Hsu

(57) ABSTRACT

The present invention provides a method for forming a semiconductor structure, including the following steps: first, a substrate is provided, an interlayer dielectric (ILD) is formed on the substrate, a first dummy gate is formed in the ILD, wherein the first dummy gate includes a dummy gate electrode and two spacers disposed on two sides of the dummy gate electrode respectively. Next, two contact holes are formed in the ILD at two sides of the first dummy gate respectively. Afterwards, the dummy gate electrode is removed, so as to form a gate recess in the ILD, a first material layer is filled in the gate recess and a second material layer is filled in the two contact holes respectively, and an anneal process is performed on the first material layer and the second material layer, to bend the two spacers into two inward curving spacers.

20 Claims, 8 Drawing Sheets

SEMICONDUCTOR STRUCTURE

BACKGROUND OF THE INVENTION

1. Field of the Invention

The present invention relates to a semiconductor structure and manufacturing methods thereof, and in particular, to a semiconductor structure with inward curving spacers and manufacturing methods thereof.

2. Description of the Prior Art

As semiconductor processes advance to the very deep sub micron level, how to increase the driving current for MOS transistors has become a critical issue in this field.

To attain higher performance of a semiconductor device, attempts have been made to use a strained silicon (Si) layer for increasing the mobility of electrons or holes. Taking advantage of a stressor is a common way to increase the effect of the MOS transistors. Forming a tensile or a compressive stressor on the substrate and using the MOS transistors to change the band structure of silicon can increase mobility of electrons.

SUMMARY OF THE INVENTION

The present invention provides a semiconductor structure, the semiconductor structure includes a substrate, having an interlayer dielectric (ILD) disposed thereon, and a first gate structure, disposed in the ILD, wherein the first gate structure comprises a gate electrode and two inward curving spacers disposed on two sides of the gate electrode.

The present invention further provides a method for forming a semiconductor structure, comprising the following steps: first, a substrate is provided, an interlayer dielectric (ILD) is formed on the substrate, a first dummy gate is formed in the ILD, wherein the first dummy gate comprises a dummy gate electrode and two spacers disposed on two sides of the dummy gate electrode respectively. Next, two contact holes are formed in the ILD at two sides of the first dummy gate respectively. Afterwards, the dummy gate electrode is removed, so as to form a gate recess in the ILD, a first material layer is filled in the gate recess and a second material layer is filled in the two contact holes respectively, and an anneal process is performed on the two spacers, to bend the two spacers into two inward curving spacers.

The key feature of the present invention is to form an inward curving spacer, the inward curving spacer has more inwardly (compressive) stress than a normal vertical spacer does, and it's useful to provide more stress to the channel of one metal oxide semiconductor field effect transistor (MOSFET). For example, the first gate structure is an N-type metal oxide semiconductor field effect transistor (NMOSFET).

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 illustrate a forming method of a semiconductor structure according to a first embodiment of the present invention, wherein:

FIG. 2 is a schematic drawing in a step subsequent to FIG. 1,

FIG. 3 is a schematic drawing in a step subsequent to FIG. 2,

FIG. 4 is a schematic drawing in a step subsequent to FIG. 3,

FIG. 5 is a schematic drawing in a step subsequent to FIG. 4, and

FIG. 6 is a schematic drawing in a step subsequent to FIG. 5.

DETAILED DESCRIPTION

Figure 1:
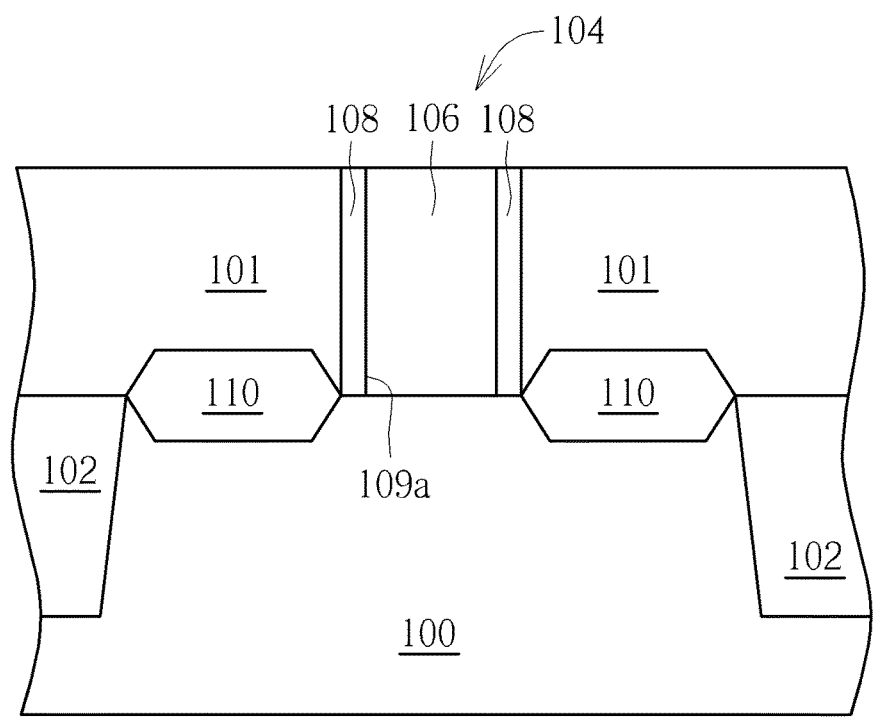

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

FIGS. 1-6 illustrate a forming method of a semiconductor structure according to a first embodiment of the present invention. First of all, a substrate 100 is provided, a dielectric layer 101 being formed on the substrate 100, at least one dummy gate structure 104 is formed on the substrate 100 and in the dielectric layer 101. The substrate 100 may include a semiconductor substrate, for example, a silicon substrate, an epitaxial silicon substrate, a silicon germanium substrate, a silicon carbide substrate or a silicon-on-insulator (SOI) substrate, or may include a non-semiconductor substrate such as a glass substrate, but this is not limited thereto. Moreover, at least one shallow trench isolation (STI) 102 may be previously formed in the substrate 100 to identify each active area.

Typical integrated circuits (e.g. semiconductor devices, semiconductor structures, etc.) may be divided into a plurality of active areas and a plurality of non-active areas. The active areas may include finFET devices (e.g. pFET, nFET, etc.). Each active area may have a different pattern density, different number of finFET devices, different type of finFET device(s), etc.

Each dummy gate structure 104 includes a dummy gate electrode 106 and two spacers 108 disposed on two sides of the dummy gate electrode 106. The dummy gate electrode 106 is not limited to be a conductive layer, it can also be an insulating layer or other suitable materials. The dummy gate electrode 106 will be removed and be replaced with other materials in the following processes. Therefore, in one preferred embodiment, the dummy gate electrode 106 and the dielectric layer 101 have different materials. In this way, the dummy gate electrode 106 and the dielectric layer 101 have different etching selectivity. Each spacer 108 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof.

It is noteworthy that when viewed in the cross section view, each spacer 108 has a vertical profile. More precisely, the sidewalls of each spacer 108 are perpendicular to the top surface of the substrate 100. Besides, each spacer 108 is adjacent to the dummy gate electrode 106. In other words, an inner sidewall 109a of the spacer 108 being directly contacts the dummy gate electrode 106. In addition, the semiconductor structure may further comprise at least one source/drain region (not shown) or epitaxial layers 110 disposed on two sides of the dummy gate structure 104. The epitaxial layer 110 may include a silicon-germanium epitaxial layer suited for a PMOS transistor, or a silicon-carbide epitaxial layer suited for an NMOS transistor, depending upon the electrical properties of the MOSFET. The epitaxial layer 110 may be formed through a molecular beam epitaxy (MBE), a co-flow epitaxial growth process, a cyclic selective epitaxial growth process or other similar processes. The processes mentioned above are well known to those skilled in the art, and will not be described in detail here.

Figure 2:
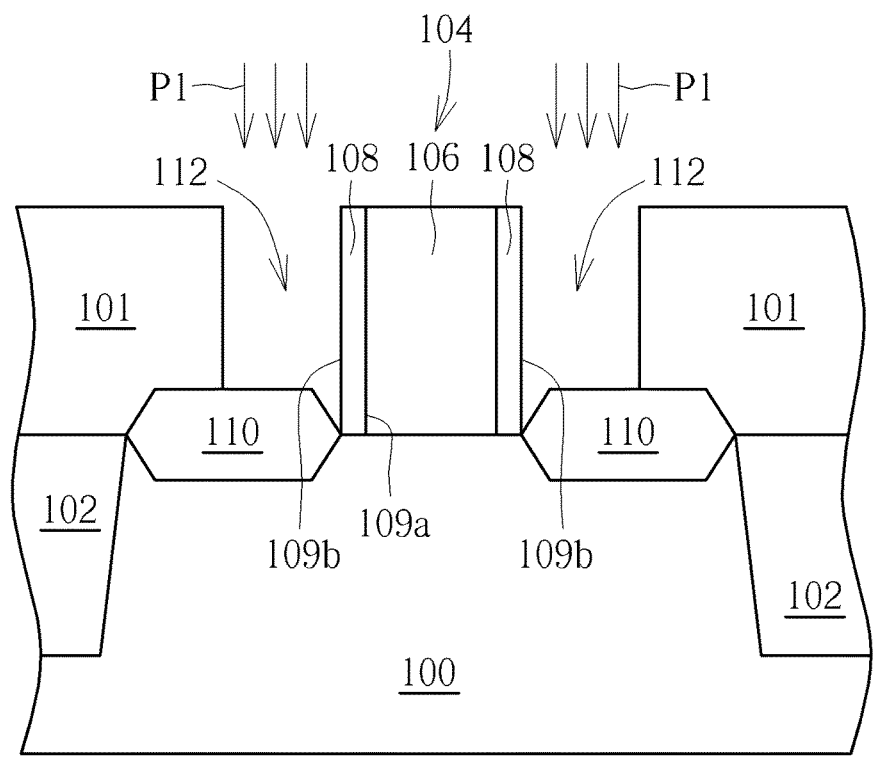

Next, as shown in FIG. 2, an etching process P1 is performed, to remove part of the dielectric layer 101 and to form two contact holes 112 on two sides of the dummy gate structure 104. The position of each contact hole 112 corresponds to the position of the source/drain region or the epitaxial layer 110. Besides, each contact hole 112 is adjacent to the spacer 108. In other words, an outer sidewall 109b of the spacer 108 is exposed by the contact hole 112.

Figure 3:
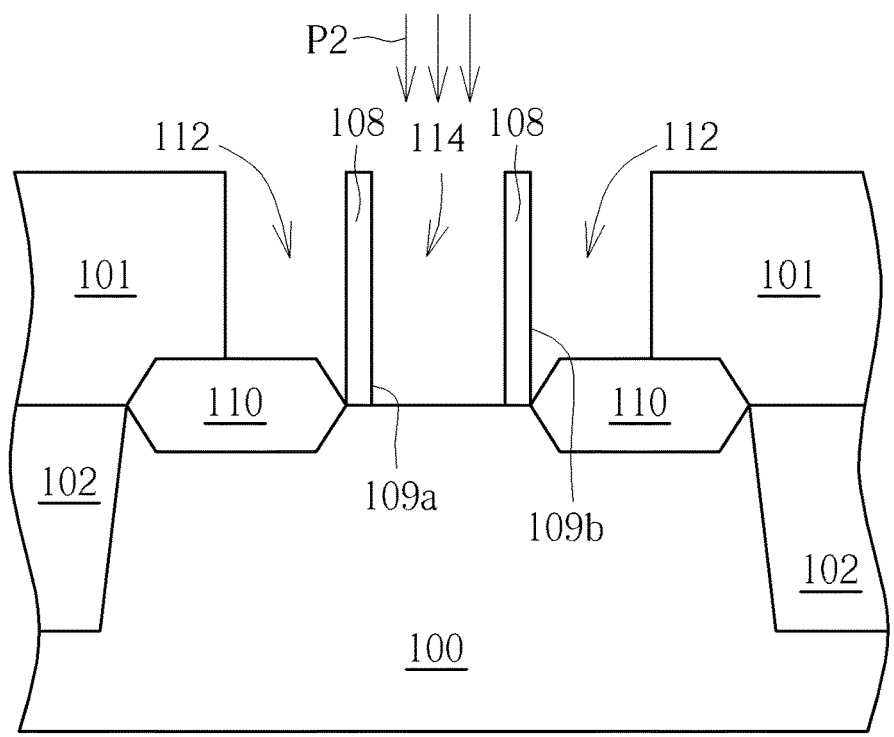
Figure 4:
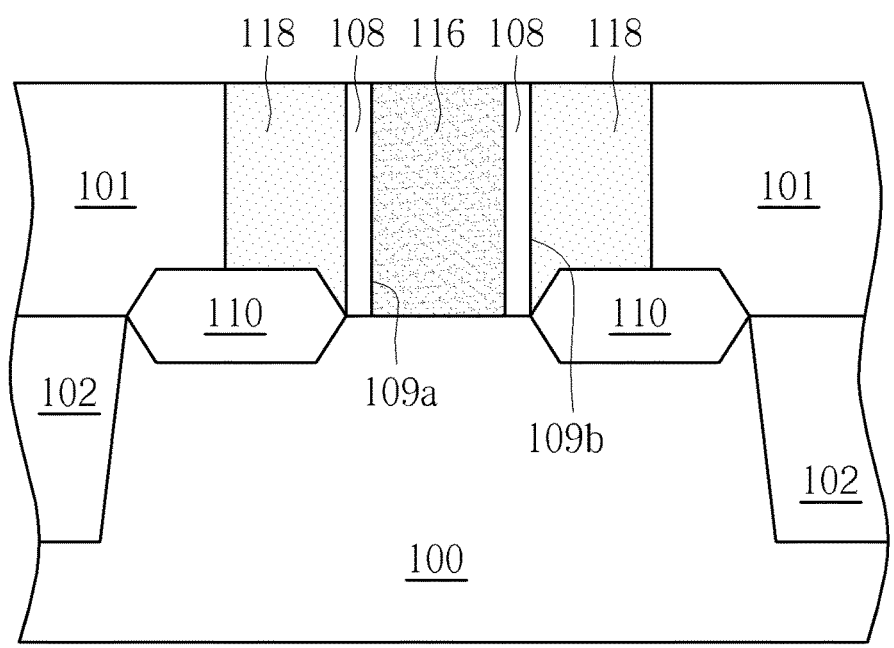

Please refer to FIGS. 3-4. As shown in FIG. 3, the dummy gate electrode 106 is removed through an etching process P2, so as to form a gate recess 114 between two spacers 108. In this step, both the inner sidewall 109a and the outer sidewall 109b of the spacer 108 are exposed. As shown in FIG. 4, a first material layer 116 is then filled into the gate recess 114, and a second material layer 118 is filled into each contact hole 112. In the present invention, the first material layer's thermal expansion coefficient is smaller than the second material layer's thermal expansion coefficient. In other words, the after anneal process or a heating process is performed on the first material layer 116 and the second material layer 118, the second material layer 118 will be expanded more than the first material layer 116 is. In one preferred embodiment of the present invention, the first material layer 116 is a spin-on dielectric (SOD) layer, and the second material layer 118 is an advanced patterning film (APF) layer, but the present invention is not limited thereto. Other suitable materials can be chosen as the materials of the first material layer 116 and the second material layer 118, and only the condition of the first material layer's thermal expansion coefficient being smaller than the second material layer's thermal expansion coefficient should be satisfied.

Besides, the steps for forming the gate recess 114, filling the first material layer 116 and forming the second material layer 118 are not limited to the sequence mentioned above. In another case, the second material layer 118 can be formed before the first material layer 116 is formed. In further another case, the contact holes 112 can also be formed after the first material layer 116 is filled in the gate recess 114, or the gate recess 114 can also be formed after the second material layer 118 is filled in the contact holes 112. It should also be within the scope of the present invention. However, after both the first material layer 116 and the second material layer 118 are formed, each spacer 108 is disposed between the first material layer 116 and the second material layer 118, and each spacer 108 contacts the first material layer 116 and the second material layer 118 directly.

Figure 5:
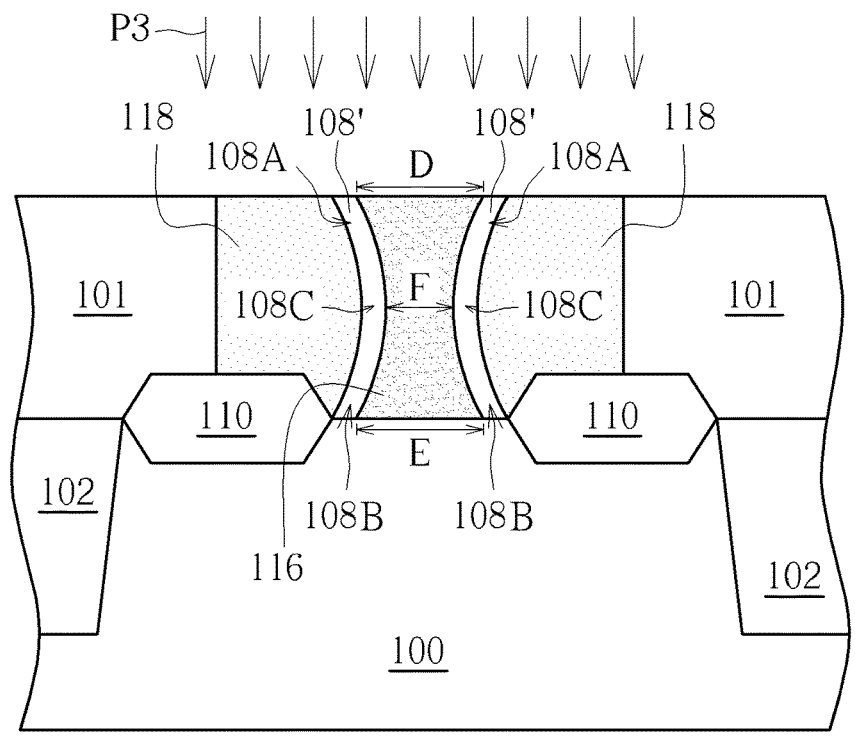

As shown in FIG. 5, an anneal process P3 is performed on the first material layer 116 and the second material layer 118. As mentioned above, since the condition of the first material layer's thermal expansion coefficient is smaller than the second material layer's thermal expansion coefficient, the second material layer 118 will be expanded more than the first material layer 116 is during the anneal process P3. The second material layer expands and squeezes each spacer 108, to change the shape of each spacer 108. Preferably, after the anneal process P3 is performed, each spacer 108 becomes an inward curving spacer 108'. More precisely, each inward curving spacer 108' comprises a top point 108A and a bottom point 108B defined at the topmost portion and at the bottommost portion of the inward curving spacer 108' respectively, and a central point 108C defined at the central portion of the inward curving spacer. The shortest distance between the two inward curving spacers 108' is the horizontal distance between the two central point 108C of the two inward curving spacers 108'. In other words, the shortest distance between two central points of the two inward curving spacers 108' (the distance F labeled in FIG. 5) is shorter than the shortest distance between two top points 108A of the two inward curving spacers 108' (the distance D labeled in FIG. 5). Similarly, the shortest distance between two central points of the two inward curving spacers 108' (the distance F labeled in FIG. 5) is shorter than the shortest distance between two bottom points 108B of the two inward curving spacers 108' (the distance E labeled in FIG. 5).

Figure 6:
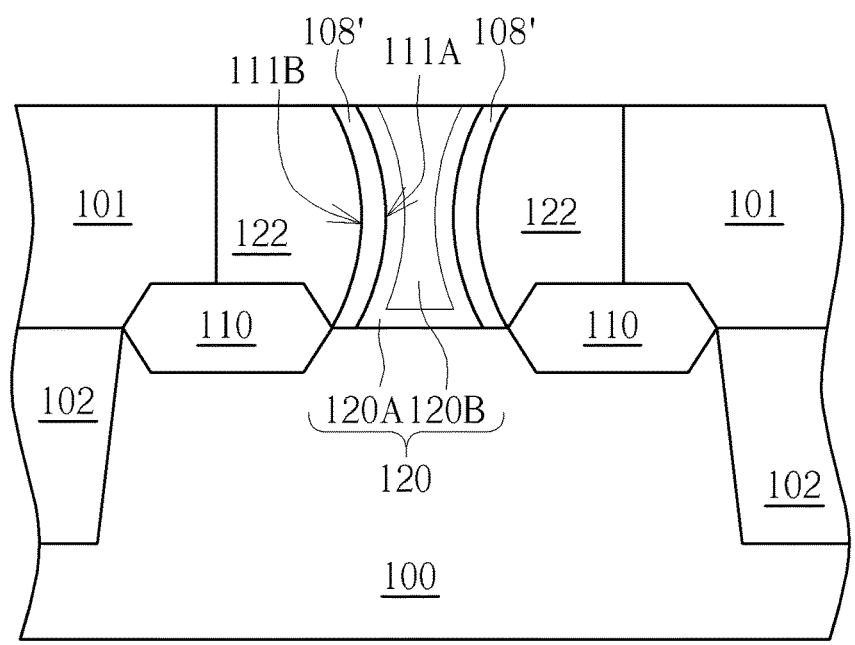

Afterwards, as shown in FIG. 6, after the inward curving spacers 108' are formed, the first material layer 116 and the second material layer 118 are removed, and a gate electrode 120 is filled into the gate recess, and a conductive layer 122 is filled into the contact holes, so as to form a first gate structure 124 on the substrate 100. The gate electrode 120 may include multiple-layers structure, for example, it may comprise a gate dielectric layer 120A and a gate conductive layer 120B. The material of the gate dielectric layer 120A may include silicon oxide (SiO), silicon nitride (SiN), silicon oxynitride (SiON), or a high-k dielectric material having a dielectric constant (k value) larger than 4 such as metallic oxide, such as hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta2O$_9$, SBT), lead zirconate titanate (PbZrxTi$_1$-xO$_3$, PZT), barium strontium titanate (BaxSr$_1$-xTiO$_3$, BST) or a combination thereof. The material of the gate conductive layer 120B may include undoped polysilicon, heavily doped polysilicon, or one or a plurality of metal layers such as a work function metal layer, a barrier layer and a low-resistance metal layer, etc. The conductive layer 122 may be materials such as tungsten (W), aluminum (Al), titanium aluminide (TiAl) or titanium aluminum oxide (TiAlO). But the present invention is not limited thereto, and the materials mentioned above can be adjusted according to actual requirements.

Figure 7:
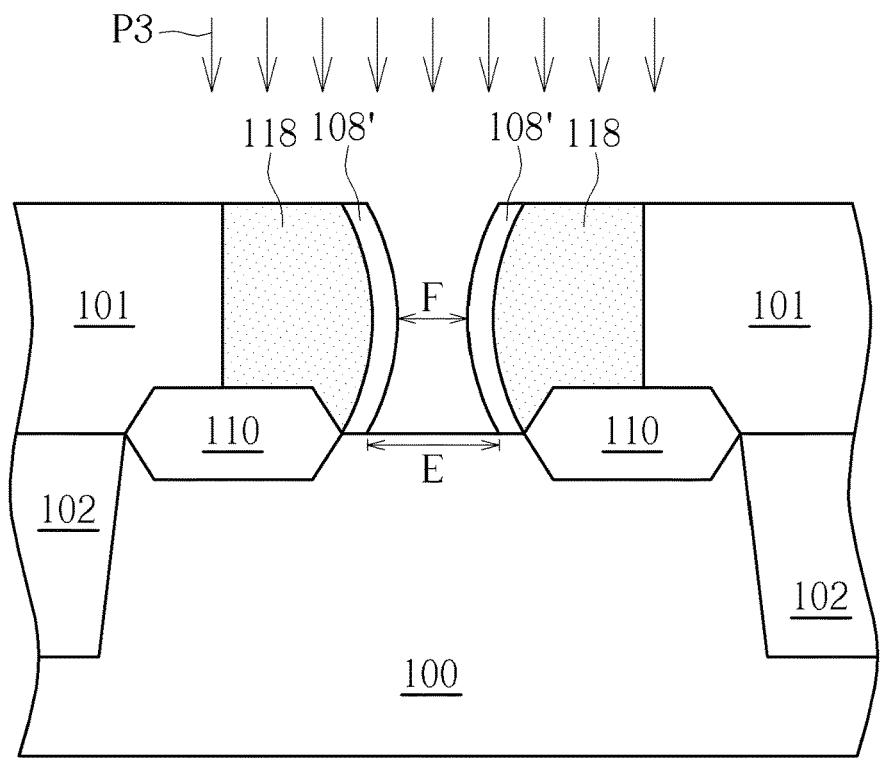
FIG. 7 illustrate a semiconductor structure according to another embodiment of the present invention.

In another embodiment of the present invention, as shown in FIG. 7, in this embodiment, after the dummy gate electrode 106 is removed and the two contact holes 112 are formed, only the second material layer 118 is filled in each contact hole 112, and the anneal process P3 is then performed, so as to form the tow inward curving spacers 208'. It should also be within the scope of the present invention.

Figure 7A:
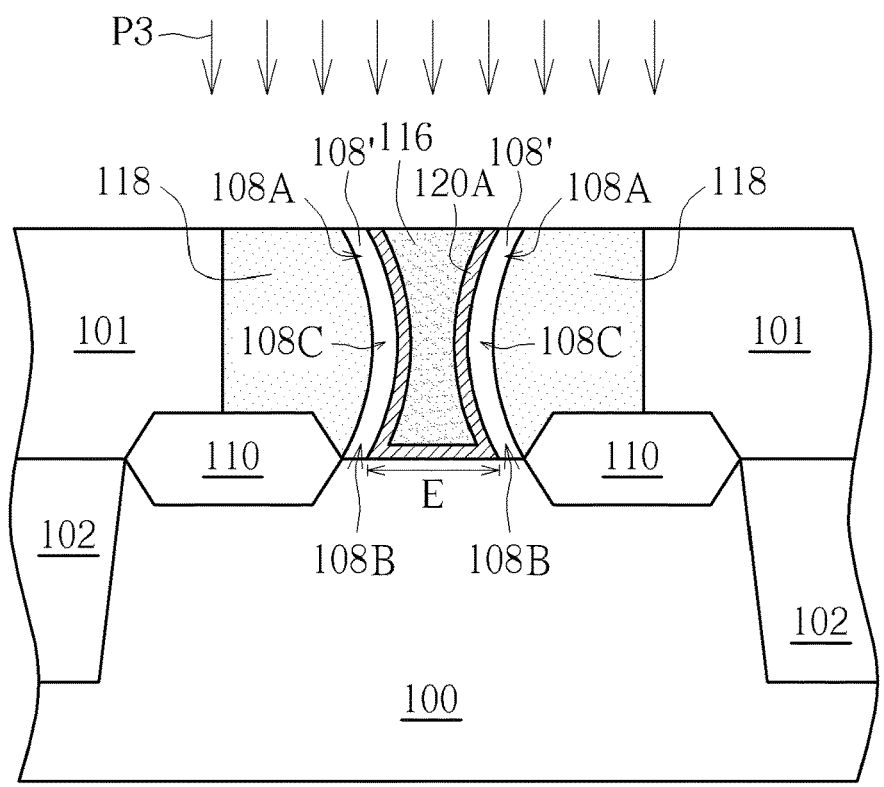
FIG. 7A illustrate a semiconductor structure according to another embodiment of the present invention.

Besides, in some embodiment of the present invention, as shown in FIG. 7A, the gate dielectric layer 120A can be formed after the dummy gate electrode 106 is removed and before the first material layer 116 is formed. In other words, the gate dielectric layer 120A is disposed between the first material layer 116 and the substrate 100. After the two inward curving spacers are formed, the first material layer 116 is then removed, and the gate conductive layer (now shown) is then formed on the gate dielectric layer 120A. It should also be within the scope of the present invention.

It is noteworthy that both the inner surface and the outer surface of each inward curving spacer 108' are not planar surfaces. For example, the inner surface 111A shown in FIG. 6 is a convex surface, and the outer surface 111B shown in FIG. 6 is a concave surface.

Afterwards, the completed transistor structure can be used as the elements of a semiconductor device, so as to form a static random access memory (SRAM) or other suitable devices. The processes mentioned above are well known to those skilled in the art, and will not be described in detail here.

The key feature of the present invention is to form an inward curving spacer, the inward curving spacer has more inwardly (compressive) stress than a normal vertical spacer does, and it's useful to provide more stress to the channel of one metal oxide semiconductor field effect transistor (MOSFET). For example, the first gate structure is an N-type metal oxide semiconductor field effect transistor (NMOSFET).

The following description will detail the different embodiments of the semiconductor structure and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
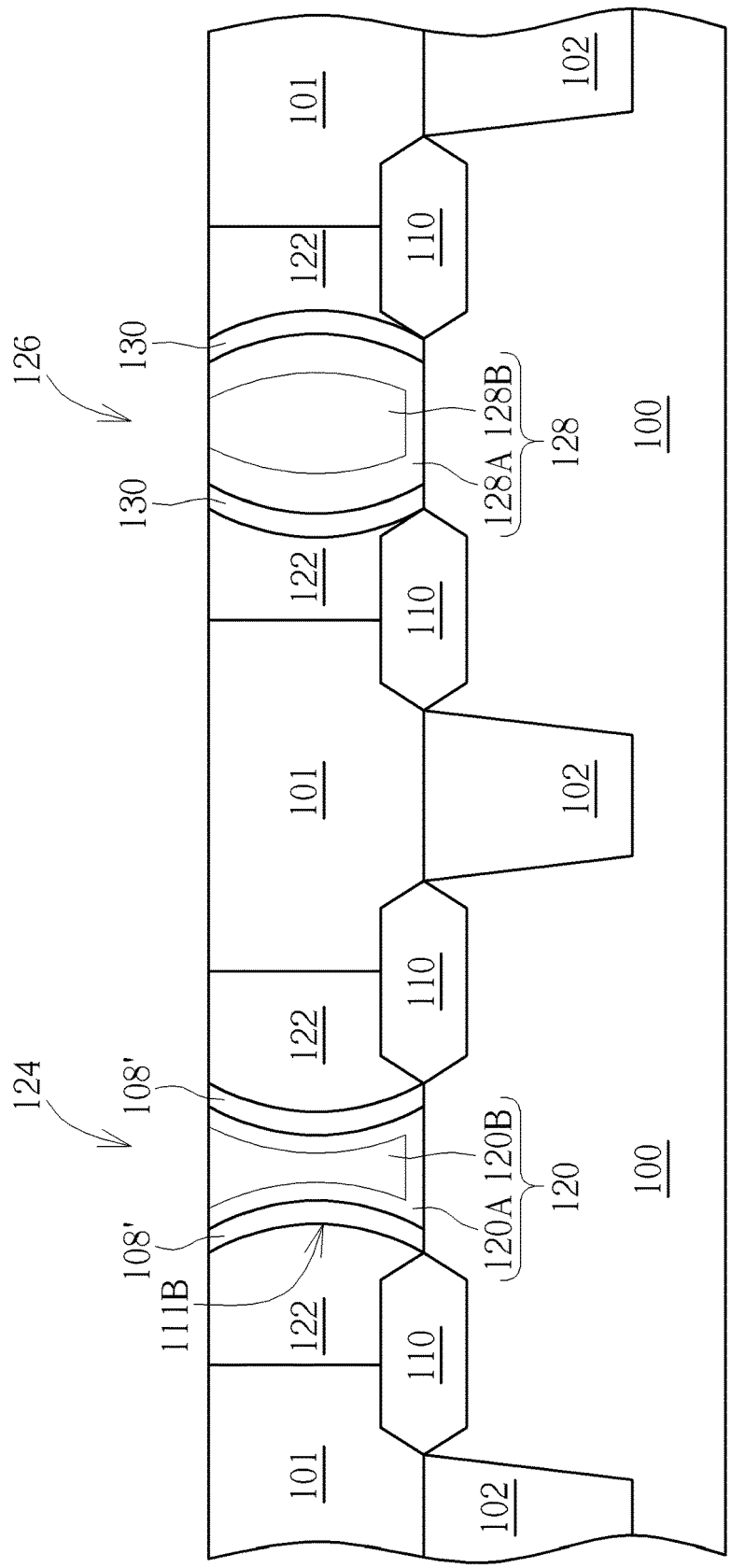
FIG. 8 illustrate a semiconductor structure according to another embodiment of the present invention.

In another embodiment of the present invention, as shown in FIG. 8, besides the first gate structure 124 mentioned above, the embodiment further comprises a second gate structure 126 disposed on the substrate 100 and in the dielectric layer 101. The second gate structure 126 comprises a second gate electrode 128 (including the second gate dielectric layer 128A and a second gate conductive layer 128B) and two outward curving spacers 130 disposed on two sides of the gate electrode 128. The method for forming the outward curving spacers 130 is similar to the method for forming the inward curving spacers 108' mentioned in the first preferred embodiment. One only needs to exchange the position of the first material layer and the second material layer (for example, the first material layer with smaller thermal expansion coefficient being filled into the contact holes, and the second material layer with larger thermal expansion coefficient being filled into the gate recess), and after performing an anneal process, the outward curving spacers 130 can be formed. The outward curving spacers 130 are useful to provide more stress to the channel of one metal oxide semiconductor field effect transistor (MOSFET). For example, the second gate structure 126 is a P-type metal oxide semiconductor field effect transistor (PMOSFET). It should also be within the scope of the present invention.

Figure 9:
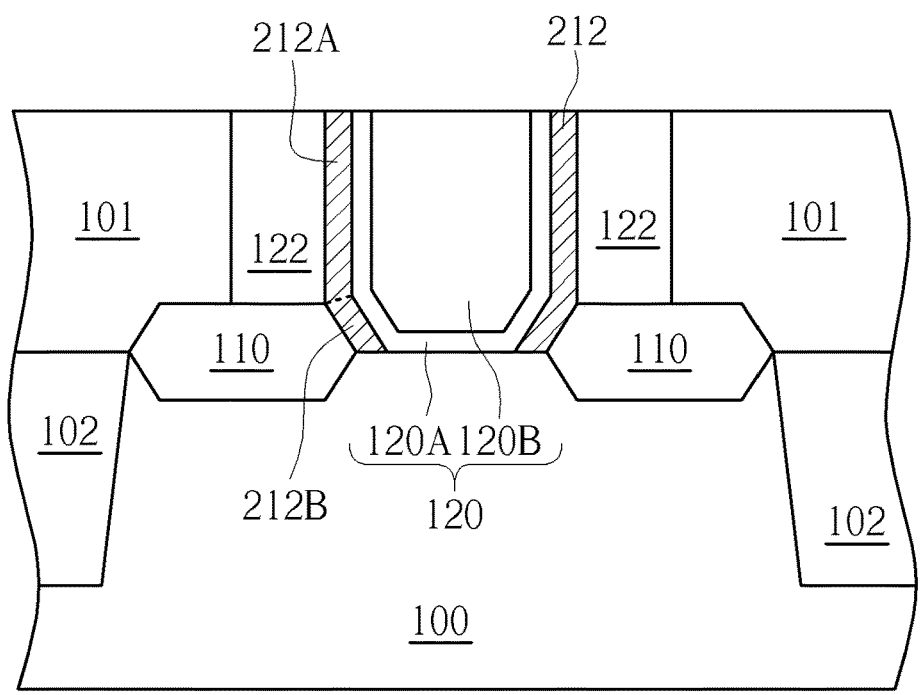
FIG. 9 illustrate a semiconductor structure according to another embodiment of the present invention.

Besides, the shape of each spacer is not limited to the one shown in the first preferred embodiment mentioned above (FIG. 5). In some embodiment of the present invention, please refer to FIG. 9, which illustrate a semiconductor structure according to another embodiment of the present invention. Each spacer 212 may has two parts: a vertical part 212A and an inward curving part 212B. The extending direction of the vertical part 212A is perpendicular to the top surface of the substrate 100, and the inward curving part 212B is closer to the gate electrode 120, in other words, the horizontal distance between two inward curving parts 212B of the spacer 212 is shorter than the horizontal distance between two vertical parts 212A of the spacer 212.

Figure 10:
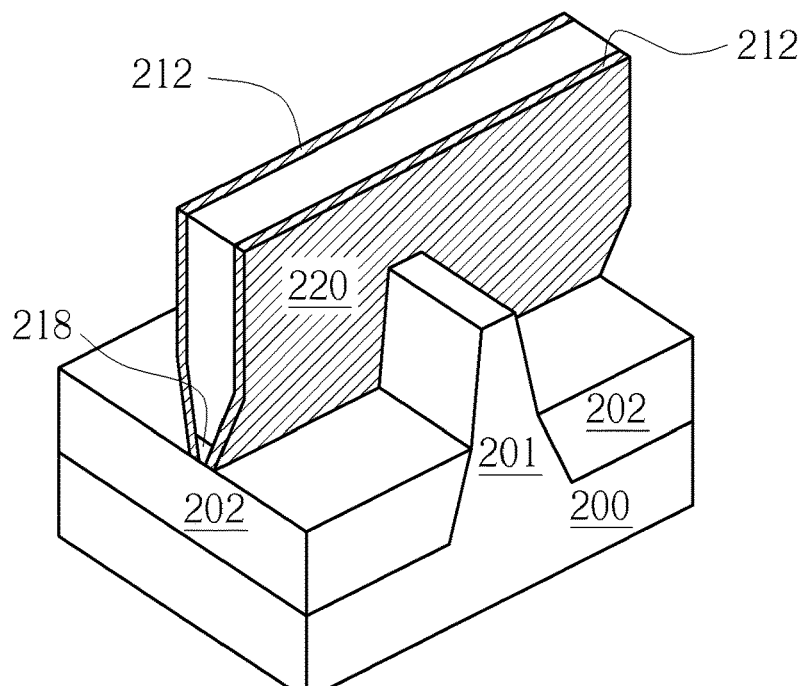
FIG. 10 illustrate a semiconductor structure according to another embodiment of the present invention.

Furthermore, the structure of the present invention can be combined with the finFET. For example, as shown in FIG. 10, a substrate 200 is provided, a fin structure 201 is disposed on the substrate 200, an insulating layer 202 is disposed on substrate 200, a gate electrode 220 crosses over the fin structure 201, and a gate oxide layer 218 may be formed between the fin structure 201 and the gate electrode 220. Besides, two spacers 212 are disposed on two sidewalls of the gate electrode respectively, each spacer 212 may has two parts: a vertical part 212A and an inward curving part 212B. In order to simplify the description, some elements such as the dielectric layer or contact structures are omitted in FIG. 9. It should also be within the scope of the present invention.

Figure 11:
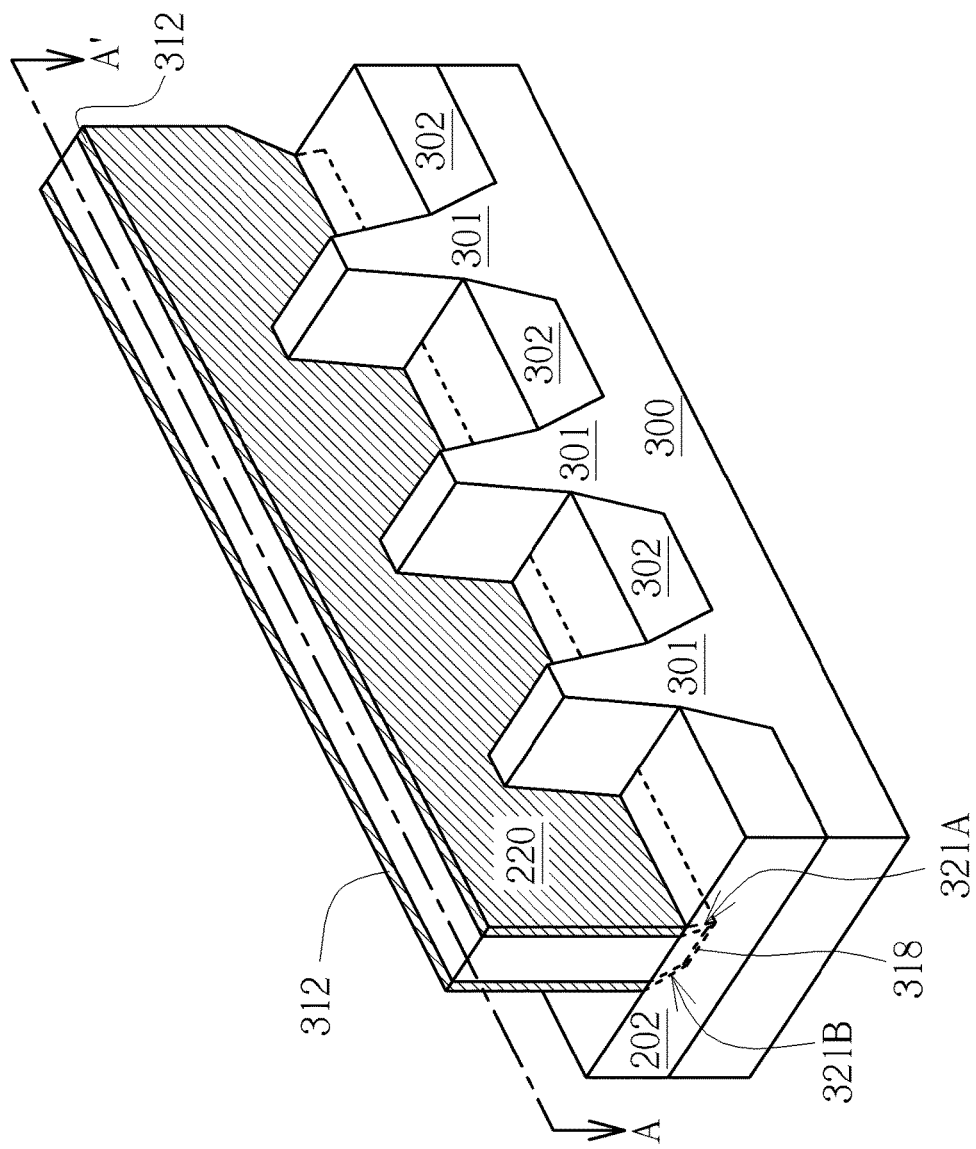
FIG. 11 illustrate a semiconductor structure according to another embodiment of the present invention.
Figure 12:
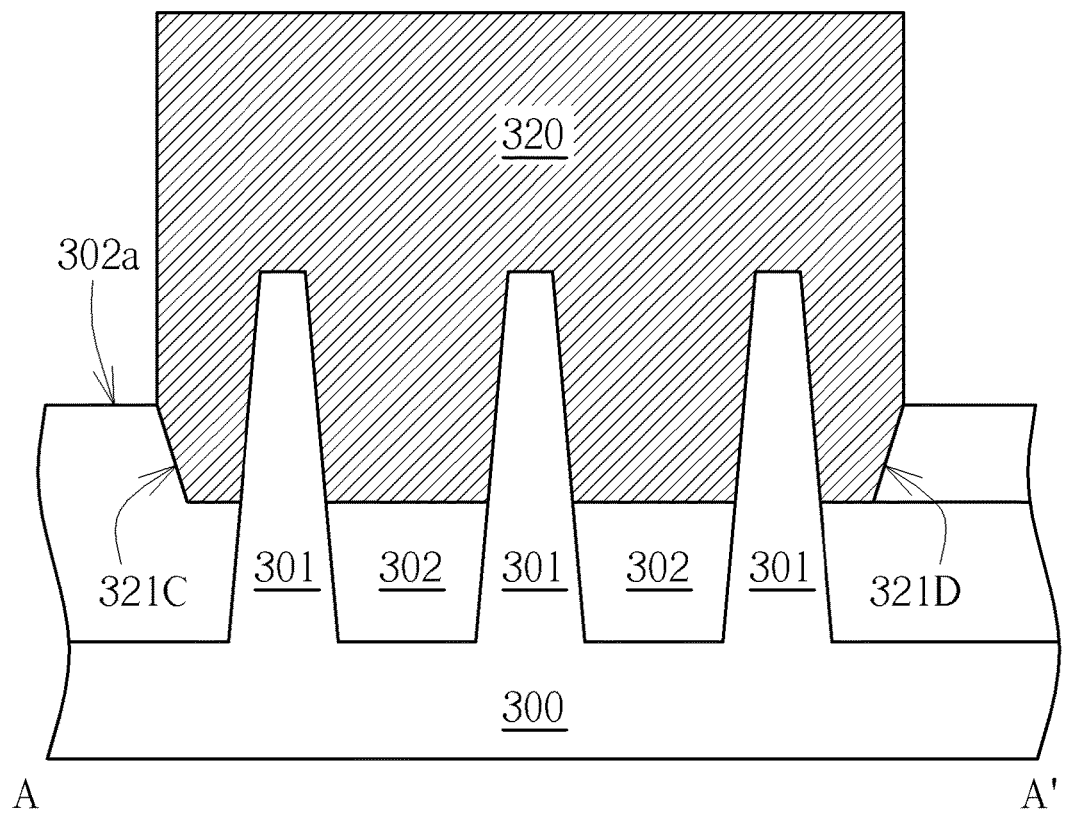
FIG. 12 illustrate a cross section diagram of a semiconductor structure according to the cross section line A-A' in FIG. 11.

In another embodiment of the present invention, please refer to FIGS. 11-12, FIG. 11 illustrate a semiconductor structure according to another embodiment of the present invention, and FIG. 12 illustrate a cross section diagram of a semiconductor structure according to the cross section line A-A' in FIG. 11. As shown in FIGS. 11-12, in this embodiment, a plurality of fin structures 301 are disposed on a substrate 300, an insulating layer 302 is disposed on substrate 300, a gate electrode 320 crosses over the fin structures 301, and a gate oxide layer 318 may be formed between the fin structure 301 and the gate electrode 320. Besides, two spacers 312 are disposed on two sidewalls of the gate electrode respectively. It is noteworthy that in this embodiment, the gate electrode 320 has four inward curving sidewalls 321A, 321B, 321C and 321D. Besides, parts of the gate electrode 320 is embedded in the insulating layer 302, in other words, the lowermost portion of the gate electrode 320 is lower than a top surface 302a of the insulating layer 302. It should also be within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate, having an interlayer dielectric (ILD) disposed thereon;
a first gate structure, disposed in the ILD, wherein the first gate structure comprises a gate electrode and two inward curving spacers disposed on two sides of the gate electrode, and the gate electrode has four inward curving sidewalls; and
a second gate structure disposed in the ILD, wherein the second gate structure comprises a second gate electrode and two outward curving spacers disposed on two sides of the gate electrode.

2. The semiconductor structure of claim 1, wherein each inward curving spacer comprises a top point and a bottom point defined at the topmost portion and at the bottommost portion of the inward curving spacer respectively, and a central point defined at the central portion of the inward curving spacer.

3. The semiconductor structure of claim 2, wherein the shortest distance between two central points of the two inward curving spacers is shorter than the shortest distance between two top points of the two inward curving spacers.

4. The semiconductor structure of claim 2, wherein the shortest distance between two central points of the two inward curving spacers is shorter than the shortest distance between two bottom points of the two inward curving spacers.

5. The semiconductor structure of claim 1, wherein the first gate structure is an N-type metal oxide semiconductor field effect transistor (NMOSFET).

6. The semiconductor structure of claim 1, wherein the second gate structure is a P-type metal oxide semiconductor field effect transistor (PMOSFET).

7. A semiconductor structure, comprising:
a substrate, having an interlayer dielectric (ILD) disposed thereon;
a first gate structure, disposed in the ILD, wherein the first gate structure comprises a gate electrode and two inward curving spacers disposed on two sides of the gate electrode, and the gate electrode has four inward curving sidewalls, and wherein the gate electrode is inwardly curved at narrowest width at a middle section thereof.

8. The semiconductor structure of claim 7, wherein each inward curving spacer comprises a top point and a bottom point defined at the topmost portion and at the bottommost portion of the inward curving spacer respectively, and a central point defined at the central portion of the inward curving spacer.

9. The semiconductor structure of claim 8, wherein the shortest distance between two central points of the two inward curving spacers is shorter than the shortest distance between two top points of the two inward curving spacers.

10. The semiconductor structure of claim 8, wherein the shortest distance between two central points of the two inward curving spacers is shorter than the shortest distance between two bottom points of the two inward curving spacers.

11. The semiconductor structure of claim 7, wherein the first gate structure is an N-type metal oxide semiconductor field effect transistor (NMOSFET).

12. The semiconductor structure of claim 7, further comprising a second gate structure disposed in the ILD, wherein the second gate structure comprises a second gate electrode and two outward curving spacers disposed on two sides of the gate electrode.

13. The semiconductor structure of claim 12, wherein the second gate structure is a P-type metal oxide semiconductor field effect transistor (PMOSFET).

14. A semiconductor structure, comprising:
a substrate, having an interlayer dielectric (ILD) disposed thereon;
a first gate structure, disposed in the ILD, wherein the first gate structure comprises a gate electrode and two inward curving spacers disposed on two sides of the gate electrode, and the gate electrode has four inward curving sidewalls; and
an epitaxial layer disposed on the substrate and adjacent to the inward curving spacer, and the epitaxial layer has a flattened hexagonal structure.

15. The semiconductor structure of claim 14, wherein each inward curving spacer comprises a top point and a bottom point defined at the topmost portion and at the bottommost portion of the inward curving spacer respectively, and a central point defined at the central portion of the inward curving spacer.

16. The semiconductor structure of claim 15, wherein the shortest distance between two central points of the two inward curving spacers is shorter than the shortest distance between two top points of the two inward curving spacers.

17. The semiconductor structure of claim 15, wherein the shortest distance between two central points of the two inward curving spacers is shorter than the shortest distance between two bottom points of the two inward curving spacers.

18. The semiconductor structure of claim 14, wherein the first gate structure is an N-type metal oxide semiconductor field effect transistor (NMOSFET).

19. The semiconductor structure of claim 14, further comprising a second gate structure disposed in the ILD, wherein the second gate structure comprises a second gate electrode and two outward curving spacers disposed on two sides of the gate electrode.

20. The semiconductor structure of claim 19, wherein the second gate structure is a P-type metal oxide semiconductor field effect transistor (PMOSFET).

* * * * *